United States Patent
Binder et al.

[11] Patent Number: 5,722,379
[45] Date of Patent: Mar. 3, 1998

[54] INTERNAL-COMBUSTION ENGINE AND PROCESS FOR APPLYING A THERMAL BARRIER LAYER

[75] Inventors: Klaus Binder, Deizisau; Karl-Ludwig Weisskopf, Leinfelden-Echterdingen; Patrick Izquierdo, Ulm, all of Germany

[73] Assignee: Daimler-Benz AG, Germany

[21] Appl. No.: 751,691

[22] Filed: Nov. 18, 1996

[30] Foreign Application Priority Data

Nov. 17, 1995 [DE] Germany ......................... 195 42 944.3

[51] Int. Cl.$^6$ .............................. F02F 3/10; B22D 19/16
[52] U.S. Cl. ............................................. 123/668; 428/629
[58] Field of Search ................................ 123/669, 668, 123/657, 670; 428/629

[56] References Cited

U.S. PATENT DOCUMENTS

| | | | |
|---|---|---|---|
| 4,526,824 | 7/1985 | Dworak et al. | 428/35 |
| 4,612,239 | 9/1986 | Dimanshteyn | 428/246 |
| 4,811,707 | 3/1989 | Pfefferle | 123/272 |
| 4,819,595 | 4/1989 | Pfefferle | 123/272 |
| 4,862,865 | 9/1989 | Dahlén et al. | 123/669 |
| 4,980,321 | 12/1990 | Tsujimura | 501/95 |
| 5,204,191 | 4/1993 | DuBois et al. | 428/650 |
| 5,262,245 | 11/1993 | Ulion et al. | 428/469 |
| 5,281,487 | 1/1994 | Rumaner et al. | 428/552 |
| 5,404,639 | 4/1995 | Guenther | 123/669 |
| 5,413,877 | 5/1995 | Griffith | 428/698 |
| 5,472,920 | 12/1995 | DuBois et al. | 501/103 |
| 5,512,382 | 4/1996 | Strangman | 428/632 |
| 5,532,057 | 7/1996 | Jones | 438/334 |

FOREIGN PATENT DOCUMENTS

| | | |
|---|---|---|
| 0 313 340 | 4/1989 | European Pat. Off. . |
| 31 33 223 | 5/1982 | Germany . |
| 42 42 099 | 6/1994 | Germany . |
| WO/92/22736 | 12/1992 | WIPO . |
| WO/93/13245 | 7/1993 | WIPO . |

*Primary Examiner*—David A. Okonsky
*Attorney, Agent, or Firm*—Evenson, McKeown, Edwards & Lenahan, P.L.L.C.

[57] ABSTRACT

This invention provides a porous thermal barrier layer for protecting parts of an internal-combustion engine having parts which are acted upon by combustion, and particularly by heat, and to a process for applying such a thermal barrier layer to these parts. The thermal barrier layer, which is formed of grains and/or fibers connected with one another on the exterior side, and is produced at least partially from a heat-resistant, temperature-shock-stable and abrasion-proof barrier material, has a heat penetration number defined by the following formula $$b = \sqrt{p \cdot C \cdot \lambda}$$

with b: the heat penetration number of the thermal barrier layer in $[J \cdot (Kcm^2 \sqrt{s})^{-1}]$,
p: the density of the thermal barrier layer in $[g/cm^3]$,
$\lambda$: the thermal conductivity of the barrier material in $[W/cmK]$, and
C: the specific heat of the barrier material in $[J/gK]$ which heat penetration number is smaller than 0.25 $[J \cdot (Kcm^2 \sqrt{s})^{-1}]$, particularly smaller than 0.1 $[J \cdot (Kcm^2 \sqrt{s})^{-1}]$. Furthermore, grains and/or fibers which are hollow are used during the application of the thermal barrier layer, so that the total porosity of the thermal barrier layer 1 is higher than 20%.

25 Claims, 1 Drawing Sheet

INTERNAL-COMBUSTION ENGINE AND PROCESS FOR APPLYING A THERMAL BARRIER LAYER

BACKGROUND AND SUMMARY OF THE INVENTION

The invention relates to a thermal barrier for protecting internal parts of a vehicle engine, and a method of applying the same.

International patent document WO 93/13245 discloses an internal-combustion engine (a diesel engine) with parts, such as pistons, which are acted upon by combustion and resultant heat, and which bound the combustion chamber. The engine components which are acted upon by fuel gas, such as the piston head of the engine, are coated by a thermal barrier layer, so that the pistons (and optional other parts) can, among other things, be subjected to higher temperature. So that the thermal barrier layer will not be destroyed (for example, as a result of a chipping-off) when exposed to jumps in temperature occurring during combustion of the fuel, the thermal barrier layer is formed of a heat-resistant, temperature-shock-stable and abrasion-proof barrier material, particularly yttric oxide ($Y_2O_3$) stabilized zirconic oxide ($ZrO_2$). The higher temperature stability of the parts should theoretically result in a lower fuel consumption, and therefore also a lower emission of harmful substances, whereby the environmental compatibility of the diesel engine would be improved. However, in practice it has been determined that a higher fuel consumption occurs, so that the previously known thermal barrier layers are insufficient and unsuitable.

It is an object of the invention to provide an improved internal-combustion engine of the above-mentioned type, such that its pollutant emission is reduced. Another object of the invention is to provide a process for applying the thermal barrier layer.

Within the meaning of the present invention, the internal-combustion engine is not limited to a diesel engine, but may be any internal-combustion engine, including a piston internal-combustion engine, and in particular, a gasoline engine.

These and other objects and advantages are achieved according to the invention by coating at least areas of the parts that are acted upon by combustion (particularly heat), with a highly porous thermal barrier layer having a particular heat penetration number according to the invention, which so far can only be reached by providing the total porosity according to the invention. As a result, the heat generated during combustion can penetrate, at most, slightly into the thermal barrier layer and into the metallic parts. As a result, only a negligible amount of heat can be intermediately stored there.

In the prior art, during combustion, in the first part of the expansion phase (which is important for the gas activity), heat flows from the working gas into the previously known thermal barrier layer. In contrast, in the case of the invention, the heat, which previously flowed out during the load cycle phase, is at least largely provided to the engine. No longer is it delivered to the unburnt gas, as was the case in the prior art, whereby it was lost for the working process. On the whole, the adiabatization of the internal-combustion engine, which is more favorable according to the invention, results in better combustion processes and low pollution values as well as in an improved efficiency.

Other objects, advantages and novel features of the present invention will become apparent from the following detailed description of the invention when considered in conjunction with the accompanying drawings.

DETAILED DESCRIPTION OF THE DRAWINGS

Figure 1:
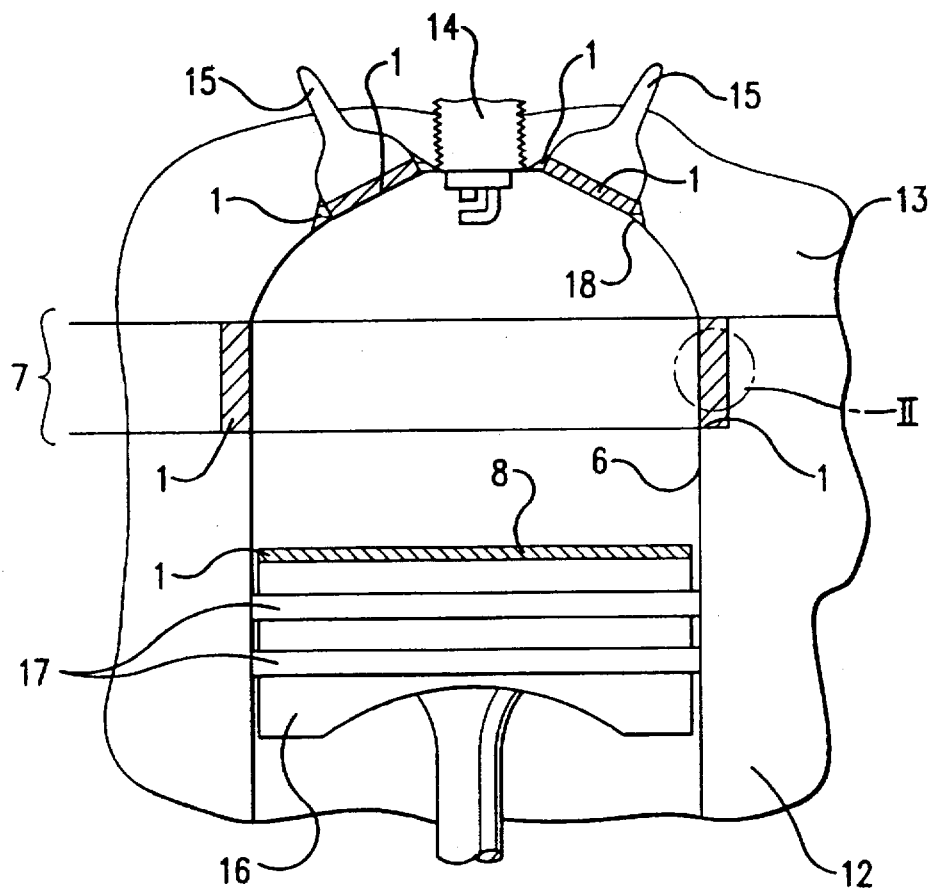
FIG. 1 is a view of a combustion chamber of an internal-combustion engine, with a thermal barrier layer arranged in the area of the compression zone.

FIG. 1 illustrates a combustion chamber of a combustion engine (in this case, an internal combustion engine). Among other parts, the combustion engine has a cylinder housing 12, a cylinder head 13, a spark plug or a glow plug 14 (depending on the type of engine), valves 15, a piston 16 with piston rings 17, and possibly an injection nozzle (not shown).

In the areas of the valve seats 18, of the valves 15 and the piston head 8 of the piston 16, the combustion chamber is coated with a thermal barrier layer 1 whose heat penetration number b is smaller than 0.25. A heat penetration number b particularly below 0.1 is more favorable because in this case the adiabatization of the combustion engine will increase. The better adiabatization is a result of the fact that the quantity of heat (and therefore energy) transferred from the working gas into the thermal barrier layer 1, and possibly into the base material of the coated part beneath the thermal barrier layer 1, is at least reduced.

Previously known thermal barriers alone cannot achieve this effect because, in the first part of the expansion phase during combustion, which is important for the gas activity, heat flows from the working gas to the insulated thermal barrier layer, and possibly to layers which follow. Absent the teaching of the present invention, this heat was then supplied to the unburnt gas during the load cycle phase, and was lost for the working process. The amount of the heat, which previously flowed off in a useless manner, can be sufficiently reduced only by the application of thermal barrier layers 1 with the given heat penetration number b according to the invention, which can be implemented by the high total porosity of the thermal barrier layer according to the invention The heat penetration number b, referred to above, is defined by the following mathematical expression:

$$b = \sqrt{p \cdot C \cdot \lambda}$$

wherein b: the heat penetration number in $[J \bullet (Kcm^2 \sqrt{s})^-]$, p: the density of the thermal barrier layer 1 in $[g/cm^3]$, $\lambda$: the thermal conductivity of the barrier material 4 in [W/cmK], and C: the specific heat of the barrier material 4 in [J/gK].

The upper limit values of these characteristics of the material of the thermal barrier layer 1 or of the barrier material 4 are as follows:

the density of the thermal barrier layer 1 is less than 5.1 g/cm$^3$, and preferably less than 3.6 g/cm$^3$;

the thermal conductivity of the barrier material 4 is less than 0.03 W/cmK, and preferably less than 0.01 W/cmk; and the specific heat C of the barrier material 4 is less than 0.4 J/gK, and preferably less than 0.25 J/gK.

The arrangement of the thermal barrier layer 1 illustrated in FIG. 1 is only an example. In principle, the thermal barrier layer 1 can be arranged on all parts which are acted upon by the combustion, and particularly the heat, such as the piston 16, the whole cylinder face 6, the spark or glow plugs 14, etc.

In order to be able to coat the discussed parts with the thermal barrier layer 1, in addition to having the above-mentioned material characteristics, the barrier material 4 must also be heat-resistant, temperature-shock-stable and abrasion-proof. Tetragonal zirconic oxide (t'-$ZrO_2$) partially stabilized with yttric oxide ($Y_2O_3$) and/or with ceric oxide ($CeO_2$) was found to be particularly advantageous for this purpose, the part of $ZrO_2$ and/or ceric oxide ($CeO_2$) being between 6% and 10%, particularly between 7% and 9%.

Figure 2:
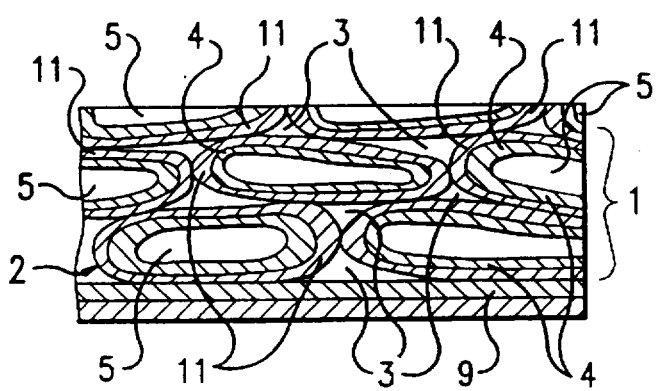
FIG. 2 is an enlarged cutout of the thermal barrier layer according to FIG. 1.

As shown in FIG. 2, the thermal barrier layer 1 is formed of a grainy and/or fibrous barrier material 4 whose grains 2 and/or fibers are connected with one another on the exterior side. At least some of the grains 2 and/or fibers have interior cavities 5. According to the invention, the thermal barrier layer 1 formed of grains 2 and/or fibers connected with one another in an adhering manner on the exterior, may also be foams.

Over its whole volume, the thermal barrier layer 1 has a total porosity greater than 20%, preferably more than 40% and most desirably more than 90%. In this case, the total porosity of the thermal barrier layer 1 is the sum of a wedge porosity and of an interior porosity, the wedge porosity being essentially formed of the exterior spaces 3 between the individual grains 2 and/or fibers of the barrier material 4 of the thermal barrier layer 1, and the interior porosity being essentially formed of the interior cavities 5 of the grains 2 and/or of the fibers within the barrier material 4.

It should be noted that the interior porosity is higher than the slip hole porosity of the grains 2 or fibers which may occur during an inappropriate solidifying of the grains 2 and/or the fibers. The proportion of the wedge porosity, according to the process, generally amounts to between 3 and 15% of the total porosity, the remaining amount being made up by the interior porosity.

In order to achieve a good exterior adhesion of the grains 2 and/or fibers of the barrier material 4 of the thermal barrier layer 1 with respect to one another, the grains 2 and/or fibers have an adhesive layer 11 which surrounds the barrier material 4 and whose layer thickness amounts to maximally 200 nm. Expediently, this adhesive layer 11 also has an anticorrosive effect. Al 203 is particularly suitable as the material for this adhesive 11 and anticorrosive layer.

Furthermore, a bonding-agent layer 9 is arranged between the thermal barrier layer 11 and the base material of the uncoated parts which are acted upon by combustion and particularly by heat. The bonding-agent layer 9 is also appropriately constructed as an anticorrosive layer. As an expedient material for the bonding-agent layer 9, an MeCrAlY alloy is particularly suitable, the metal (me) comprising nickel (Ni) and/or iron (Fe) and/or cobalt (Co).

The coating of parts with the thermal barrier layer 1 can take place, for example, by means of prefabricated and preformed thermal barrier layers 1. However, it is advantageous to apply the thermal barrier layer by means of a plasma spraying process (APS) and/or by means of an electron beam physical vapor deposition (EB-PVD).

Figure 3:
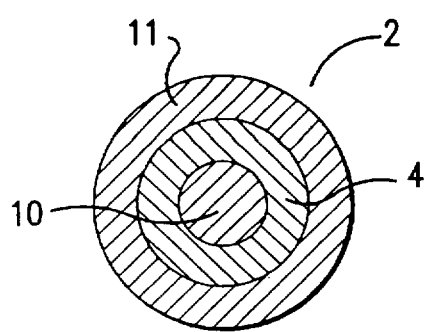
FIG. 3 is a view of the initial product having the barrier material for producing the thermal barrier layer according to FIGS. 1 and 2.

In the case of an APS process, which was carried out by means of a PT-F4 burner and a PT 2000 control box, agglomerated and/or sintered grains 2 and/or fibers of a diameter of between 45 and 125 μm were used as the starting material, as illustrated in FIG. 3. On the inside, the grains 2 and/or fibers have a core 10 which is surrounded by the barrier material 4. The barrier material 4, preferably with 8% by weight $Y_2O_3$, partially stabilized t'-$ZrO_2$, is at least in areas surrounded by the adhesive layer 11 made particularly of $Al_2O_3$, which is expediently applied in a sol/gel process.

By means of the APS-process, a thermal barrier layer 1 with a layer thickness of 2 mm was produced, the additional process parameters being as follows:

Spraying Configuration: Nozzle 300-002; powder tube diameter 2 mm; powder tube position 12:00; powder tube holder 90°; and distance of nozzle to powder tube 6 mm;

Spraying Parameters: Current intensity 55 A; primary gas argon (Ar) 37 l/min; secondary gas $H_2$, 10 l/min; powder carrier gas Ar 3.5 l/min; powder rate 40 g/min; distance of the part to be charged from the nozzle 150 mm; spraying angle of the plasma jet to the part to be coated 65°; and preheating of the part to be coated 300° C.

During the application of the thermal barrier layer 1, the core 10, which is formed of a substance that can be evaporated under the application conditions (particularly of a plastic material) is thermally removed by evaporation, forming interior cavities 5 which are responsible for the interior porosity. During the removal of the core 10, the wall of the grain 2 and/or of a fiber formed of the barrier material and of the adhesive layer 11 may open up.

Furthermore, during the application of the thermal barrier layer 1, the grains 2 and/or fibers are simultaneously also connected with one another on the exterior side in an adhesive manner by means of the adhesive 11 and anticorrosive layer. At the same time, they form the exterior cavities 3 caused the wedge porosity.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Internal-combustion engine having at least a combustion chamber, wherein parts within the combustion chamber which are exposed to combustion, are at least partially coated with a porous thermal barrier layer having a total porosity of more than 20%, said barrier layer comprising a barrier material which is resistant to heat, temperature-shock and abrasion, said material comprising at least one of hollow grains and hollow fibers connected with one another on an exterior side thereof, the thermal barrier layer having a heat penetration number defined by the following formula:

$$b = \sqrt{p \bullet C \bullet \lambda}$$

with b: the heat penetration number in $[J \bullet (Kcm^2 \sqrt{s})^{-1}]$, p: the density of the thermal barrier layer in $[g/cm^3]$, λ: the thermal conductivity of the barrier material in [W/cmK], C: the specific heat of the barrier material in [J/gK]

wherein said heat penetration number is smaller than 0.25 $[J \bullet (Kcm^2 \sqrt{s})^{-1}]$; and wherein a thermal conductivity λ of the barrier material is lower than 0.03 W/cmK.

2. Internal-combustion engine according to claim 1, wherein the heat penetration number is less than 0.1 [J•(Kcm² √s)⁻¹].

3. Internal-combustion engine according to claim 1, wherein:

total porosity of the thermal barrier layer comprises a sum of a wedge porosity and an interior porosity, the wedge porosity being formed by exterior cavities between the at least one of individual grains and fibers of the barrier material of the thermal barrier layer, and the interior porosity being formed by interior cavities in at least some of the grains or fibers;

the interior porosity is larger than a slip hole porosity; and the total porosity is greater than 40% of the total volume of the thermal barrier layer, the wedge porosity amounting to between 3 and 15%.

4. Internal-combustion engine according to claim 1, wherein:

total porosity of the thermal barrier layer comprises a sum of a wedge porosity and an interior porosity, the wedge porosity being formed by exterior cavities between the at least one of individual grains and fibers of the barrier material of the thermal barrier layer, and the interior porosity being formed by interior cavities in at least some of the at least one of grains and fibers, the interior porosity being larger than a slip hole porosity;

the total porosity is in a range of approximately 90% to 95% of total volume of the thermal barrier layer; and the wedge porosity amounts to less than 15% of total porosity.

5. Internal-combustion engine according to claim 1, wherein:

the density of the thermal barrier layer is less than 5.1 g/cm³;

the thermal conductivity of the barrier material is less than 0.01 W/cmK; and the specific heat C of the barrier material is less than 0.4 J/gK.

6. Internal-combustion engine according to claim 5 wherein the density of the barrier material is less than 3.6 g/cm³, and the specific heat of the barrier material is less than 0.25 J/gK.

7. Internal-combustion engine according to claim 1, wherein:

the internal-combustion engine is a piston internal-combustion engine;

a part which is acted upon by combustion within the combustion chamber is a cylinder face of the piston internal-combustion engine; and the cylinder face is coated with the thermal barrier layer at least in the area of a compression zone thereof.

8. Internal-combustion engine according to claim wherein:

the internal-combustion engine is a piston internal-combustion engine;

a part which is acted upon by the combustion within the combustion chamber is a piston head of the piston internal-combustion engine; and the piston head has the thermal barrier layer applied thereto.

9. Internal-combustion engine according to claim 1, wherein the thermal barrier layer comprises zirconic oxide ($ZrO_2$) partially stabilized with at least one of yttric oxide ($Y_2O_3$) and ceric oxide ($CeO_2$).

10. Internal-combustion engine according to claim 1, wherein the thermal barrier layer comprises zirconic oxide ($ZrO_2$) partially stabilized with at least one of yttric oxide ($Y_2O_3$) and ceric oxide ($CeO_2$), the part comprising zirconic oxide $ZrO_2$ and ceric oxide ($CeO_2$) amounting to between 6% and 10%.

11. Internal-combustion engine according to claim 10 wherein the part comprising zirconic oxide ($ZrO_2$) and ceric oxide ($CeO_2$) is between 7% and 9%.

12. Internal-combustion engine according to claim 1, wherein a bonding-agent layer is arranged between the thermal barrier layer and the base material of an uncoated part acted upon by combustion.

13. Internal-combustion engine according to claim 1, wherein:

between the thermal barrier layer and the base material of the uncoated part acted upon by the combustion, a bonding-agent layer is arranged; and the bonding-agent layer is also an anticorrosive layer.

14. Internal-combustion engine according to claim 1, wherein:

between the thermal barrier layer and the base material of the uncoated part acted upon by the combustion, a bonding-agent layer is arranged; and the bonding-agent layer is an MeCrAlY layer, the Me comprising at least one of the materials Ni, Fe and Co.

15. Process for protecting at least a part of a combustion engine which is acted upon by combustion, by applying a thermal barrier layer comprising a barrier material which is highly resistant to heat, temperature-shock and abrasion, said material having a total porosity of at least 20% and comprising at least one of hollow grains and hollow fibers which are externally connected with one another; said method comprising the steps of:

providing the at least one of grains and fibers comprising a barrier material which has a thermal conductivity λ less than 0.03 W/cmK; and applying said at least one of grains and fibers to said at least a part of said combustion engine.

16. Process according to claim 13, wherein said at least one of grains and fibers have a core which is surrounded by the barrier material and can be removed thermally, said process further comprising the step of removing the core, forming an interior cavity which provides an interior porosity.

17. Process according to claim 15, wherein:

the thermal barrier layer is applied by means of plasma spraying;

said at least one of grains and fibers have an interior core which is surrounded by the barrier material and can be removed thermally; and the core is removed during application of said barrier layer, forming an interior cavity which provides an interior porosity.

18. Process according to claim 17, wherein the core is evaporated.

19. Process according to claim 17, wherein the core is evaporated at a temperature below 400° C.

20. Process according to claim 15, wherein:

before connecting said at least one of grains and fibers to form the thermal barrier layer, an adhesive layer is applied to an exterior of said at least one of grains and the fibers; and during formation of the thermal barrier layer, the at least one of grains and the fibers are connected with one another by means of the adhesive layer.

21. Process according to claim 15, wherein said adhesive layer has a thickness of up to 200 nm.

22. Process according to claim 13, wherein said adhesive layer comprises $Al_2O_3$.

23. Process according to claim 15, wherein said adhesive layer is applied to said at least one of grains and fibers by means of a sol/gel process.

24. Process according to claim 15, wherein the thermal barrier layer is applied by one of an electron beam physical vapor deposition (EP-PVD) process and by an atmospheric plasma spraying process (APS).

25. A protective layer for protecting parts of a combustion engine which are exposed to high temperatures generated by combustion of fuel in said engine, said protective layer comprising a porous thermal barrier layer having a total porosity of more than 20%, said barrier layer being formed of a barrier material which is resistant to heat, temperature-shock and abrasion, said barrier material comprising at least one of hollow grains and hollow fibers connected with one another on an exterior side thereof, the thermal barrier layer having a heat penetration number defined by the following formula:

$$b = \sqrt{p \cdot C \cdot \lambda}$$

with b: the heat penetration number in $[J \bullet (Kcm^2 \sqrt{s})^{-1}]$, p: the density of the thermal barrier layer in $[g/cm^3]$, $\lambda$: the thermal conductivity of the barrier material in [W/cmK], C: the specific heat of the barrier material in [J/gK]

wherein said heat penetration number is smaller than 0.25 $[J \bullet (Kcm^2 \sqrt{s})^{-1}]$; and wherein a thermal conductivity $\lambda$ of the barrier material is lower than 0.03 W/cmK.

* * * * *